(12) United States Patent
Cheung

(10) Patent No.: US 6,818,066 B2
(45) Date of Patent: Nov. 16, 2004

(54) METHOD AND APPARATUS FOR TREATING A SUBSTRATE

(75) Inventor: Robin Cheung, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 516 days.

(21) Appl. No.: 09/850,841

(22) Filed: May 7, 2001

(65) Prior Publication Data

US 2001/0055934 A1 Dec. 27, 2001

Related U.S. Application Data

(63) Continuation-in-part of application No. 09/599,125, filed on Jun. 22, 2000, now Pat. No. 6,645,550.

(51) Int. Cl.[7] .................................................. C23C 8/80
(52) U.S. Cl. .................... 118/715; 118/728; 451/67; 156/345; 204/224 M; 134/902
(58) Field of Search .................. 118/715, 728, 118/66, 319, 320, 50, 58; 451/67, 54, 53; 156/345; 204/224 M; 134/902

(56) References Cited

U.S. PATENT DOCUMENTS

| | | | |
|---|---|---|---|
| 2,369,620 A | 2/1945 | Sullivan et al. ............. 117/130 |
| 4,397,812 A | 8/1983 | Mallory, Jr. ................. 420/441 |
| 5,147,692 A | 9/1992 | Bengston ..................... 427/438 |
| 5,248,527 A | 9/1993 | Uchida et al. .............. 427/437 |
| 5,300,155 A | 4/1994 | Sandhu et al. ................ 148/33 |
| 5,429,711 A | 7/1995 | Watanabe et al. ............. 216/52 |
| 5,618,227 A | 4/1997 | Tsutsumi et al. ........... 451/288 |
| 5,830,045 A | 11/1998 | Togawa et al. ............. 451/288 |
| 5,885,134 A | 3/1999 | Shibata et al. ................ 451/41 |
| 5,895,270 A | 4/1999 | Hempel, Jr. ................. 438/692 |
| 5,910,340 A | 6/1999 | Uchida et al. .............. 427/437 |
| 5,922,136 A | 7/1999 | Huang ............................ 134/2 |
| 6,000,997 A | 12/1999 | Kao et al. ...................... 451/7 |
| 6,015,724 A | 1/2000 | Yamazaki ................... 438/151 |
| 6,026,830 A | 2/2000 | Huang ........................ 134/66 |
| 6,051,477 A | 4/2000 | Nam ......................... 438/404 |
| 6,066,030 A * | 5/2000 | Uzoh .......................... 451/41 |
| 6,074,276 A | 6/2000 | Shibata et al. ................. 451/8 |
| 6,110,011 A | 8/2000 | Somekh et al. .............. 451/28 |
| 6,136,163 A | 10/2000 | Cheung et al. ............. 204/198 |
| 6,150,271 A | 11/2000 | Easter et al. ................ 438/692 |
| 6,155,275 A * | 12/2000 | Shinbara ..................... 134/61 |
| 6,207,005 B1 * | 3/2001 | Henley et al. ......... 156/345.32 |
| 6,360,687 B1 * | 3/2002 | Yanagisawa et al. ....... 118/723 MW |

OTHER PUBLICATIONS

Lin et al. "Manufacturing of Cu/Electroless Nickel/Sn–Pb Flip Chip Solder Bumps", IEEE Transactions on Advanced Packaging, vol. 22, No. 4, pp. 575–579, Nov., 1999.
Lopatin et al. "Thin Electroless Barrier for Copper Films", Part of the SPIE Conference on Multilevel Interconnect Technology II, vol. 3508, pp. 65–77, Sep., 1998.

* cited by examiner

Primary Examiner—Laura Edwards
(74) Attorney, Agent, or Firm—Moser, Patterson & Sheridan

(57) ABSTRACT

A system and method for treating a substrate by integrating the annealing of a metal-containing layer on a substrate as part of a chemical mechanical polishing process. In one embodiment, a system for treating a substrate generally includes an annealing station incorporated into a chemical mechanical polishing processing system that includes a deposition station utilized to form a metal-containing layer on the substrate.

13 Claims, 6 Drawing Sheets

METHOD AND APPARATUS FOR TREATING A SUBSTRATE

This application is a continuation-in-part of U.S. patent application Ser. No. 09/599,125, filed Jun. 22, 2000 by Cheung et al., now U.S. Pat. No. 6,645,550, which is incorporated herein by reference in its entirety.

BACKGROUND OF THE DISCLOSURE

1. Field of the Invention

Embodiments of the invention relate to a method and apparatus for substrate treatment.

2. Description of the Related Art

Copper and its alloys are increasingly being used for metal interconnects in advanced integrated circuit fabrication because they have lower resistivities compared to aluminum. Copper can be deposited over high aspect ratio via and contact structures using metal electroplating. A typical electroplating method generally comprises vapor depositing a barrier layer over the via or contact, vapor depositing a conductive metal seed layer, e.g., copper, over the barrier layer, followed by electroplating a conductive metal over the seed layer to fill the via or contact structure. Finally, chemical mechanical polishing (CMP) can be used to define a planarized conductive interconnect feature by polishing the electroplated metal layer. Generally, CMP is preformed by providing relative motion between a substrate pressed against a polishing surface. A polishing fluid is provided between the substrate and polishing surface to chemically assist in the removal of material from the polished substrate surface. Some polishing fluid may additionally contain abrasives.

However, defects may be introduced into the planarized conductive layer after CMP. These defects may include, for example, particulate or chemical contamination, physical damage, discontinuity in the conductive layer, and so on. Therefore, the planarized metal layer is subjected to various post-CMP cleaning or treatment (e.g., thermal or plasma anneal) steps prior to additional processing such as subsequent deposition of a dielectric layer. However, even after post-CMP cleaning or treatment, problems may still be present in subsequent processing like continued vulnerability to chemical corrosion, or failure to provide a good adhesive surface for a subsequently deposited layer such as a dielectric layer.

Therefore, there is an ongoing need for improved systems for post-CMP treatment of metal layers, and also concomitant with CMP methods of treatment as well.

SUMMARY OF THE INVENTION

A system and method for treating a substrate following a chemical mechanical planarization process is generally provided. In one aspect, a system for treating a substrate generally includes a polisher, an annealing station and an optional deposition station. The polisher generally performs a chemical mechanical polishing process on the substrate. The deposition station generally forms a metal-containing layer on the substrate which is treated in the annealing station. In one embodiment, the deposition station and annealing station are disposed in a factory interface which is coupled to the polisher. The deposition station may optionally be incorporated into a cleaner residing within the factory interface. In another embodiment, the deposition station and annealing station are disposed on the polisher.

In another aspect of the invention, a method for treating a substrate generally includes chemical mechanical polishing the substrate, forming a metal-containing layer on the substrate and annealing the metal-containing layer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Embodiments of the invention generally provide a system and method for treating a substrate such as a semiconductor wafer by integrating the annealing of a metal-containing layer on a substrate as part of a chemical mechanical polishing system. In one aspect of the invention, an annealing station is incorporated into a chemical mechanical polishing processing system that includes a deposition station utilized to form a metal-containing layer on the substrate after polishing. In another aspect of the invention, an annealing station is incorporated into a chemical mechanical polishing processing system that includes a deposition station utilized to form a metal-containing layer on the substrate before polishing. In one embodiment, the substrate comprises a copper layer that has been formed on a semiconductor substrate. As an illustration, the treatment method of the invention is performed on the copper layer after the substrate has been subjected to chemical mechanical polishing (CMP).

Apparatus

Figure 1:
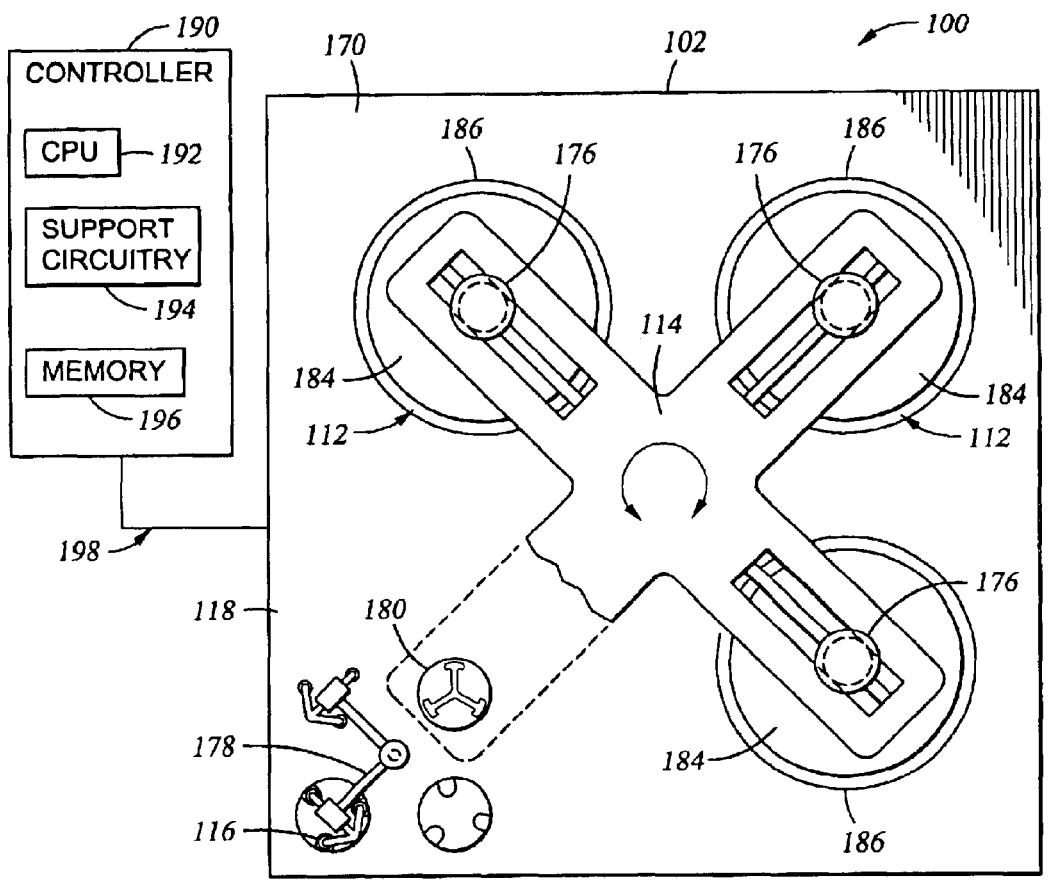
FIG. 1 depicts one embodiment of a chemical mechanical polishing system having an annealing station.
Figure 1:
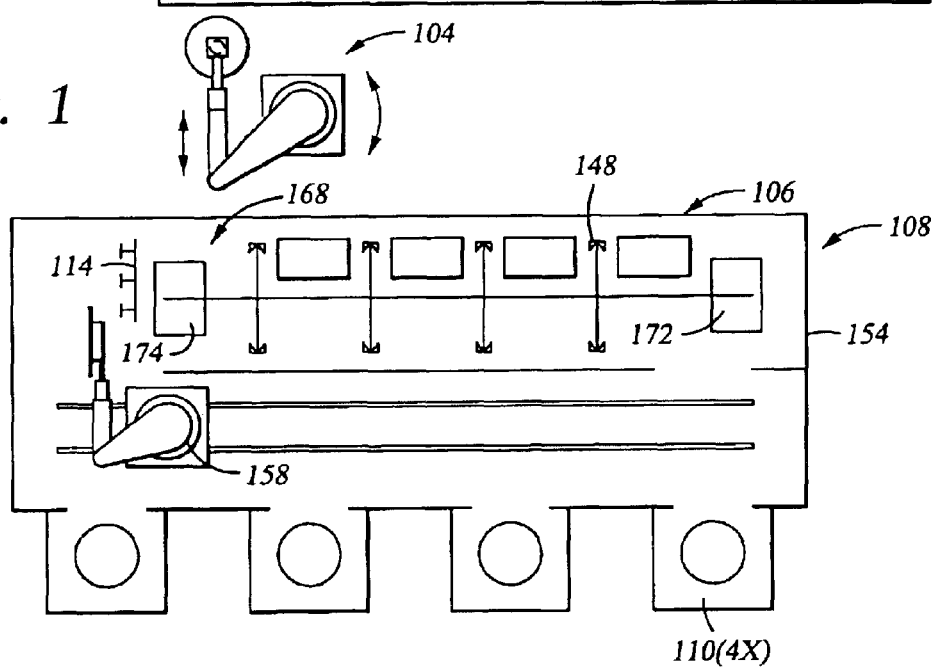

FIG. 1 illustrates a simplified plan view of one embodiment of a chemical mechanical polishing system 100. The system 100 generally includes a polisher 102, a transfer robot 104 and a factory interface 108. A post-CMP treatment module 168 is typically disposed within the factory interface 108. The post-CMP treatment module 168 generally includes an annealing station 172 and a deposition station 174. The annealing station 172 and the deposition station 174 may be positioned adjacent each other, in a space-apart relation, or in different areas within the system 100. The post-CMP treatment module 168 may additionally include a cleaner 106. One example of a polishing system that may be adapted to benefit from the invention includes a MIRRA MESA™ CMP system, available from Applied Materials, Inc., of Santa Clara, Calif. A description of the MIRRA MESA™ CMP system is disclosed in commonly-assigned U.S. patent application Ser. No. 09/547,189, filed on May 11, 2000 now U.S. Pat. No. 6,361,422 by Ettinger et al., which is incorporated herein by reference in its entirety. Although the post-CMP treatment module 168 is shown disposed in the factory interface 108 as an integral component in the chemical mechanical polishing system 100 described with reference to FIG. 1, the invention has utility in other polishing systems that both polish substrates and deposit a metal-containing layer thereon, including systems that anneal the metal-containing layer before and/or after polishing.

In one embodiment, the factory interface 108 includes a plurality of substrate cassettes 110, at least one or more interface robots 158, an input module 144 and the post-CMP treatment module 168. The factory interface robot 158 generally provides the range of motion required to transfer substrates between the cassettes 110 and other modules (i.e., the input module 144 and the post-CMP treatment module 168) of the system 100. Examples of a robot that may be utilized as the factory interface robot 158 are a 4-Link robot, manufactured by Kensington Laboratories, Inc., of Richmond, Calif. and a model Equipe 407B, manufactured by PRI Automation, of Billerica, Mass.

Unprocessed substrates are generally transferred from the cassettes 110 to the input module 144 by the interface robot 158. The input module 144 generally facilitates transfer of the substrate between the interface robot 158 and the transfer robot 104. The transfer robot 104 transfers the substrate between the input module 144 and the polisher 102. Processed substrates are generally returned to cassettes 110 disposed in the factory interface 108 in the reverse manner.

The transfer robot 104 may be any number of robots utilized to transfer substrates in a CMP environment. Generally, the transfer robot 104 is substantially similar to the factory interface robot 108.

The polisher 102 generally comprises a base 170, a transfer station 118, one or more polishing heads 176, a CMP robot 114 and one or more polishing stations 112. The transfer station 118 is disposed on the base 170 and generally includes a robot interface 116, transfer station robot 178 and a load cup 180. The robot interface 116 is configured to accept the substrate from the transfer robot 104. The transfer station robot 178 transfers the substrate between the robot interface 116 and the load cup 180. The load cup 180 generally transfers the substrate to the polishing head 176 that retains the substrate during polishing. One load cup 180 that may be adapted to benefit from the invention is described in U.S. patent application Ser. No. 09/414,907, filed on Oct. 8, 1999 now U.S. Pat. No. 6,716,086 by Tobin, which is incorporated by reference herein in its entirety. One transfer station 118 that may be adapted to benefit from the invention is described in U.S. Pat. No. 6,156,124, issued Dec. 5, 2000 to Tobin, which is also incorporated by reference herein in its entirety.

The CMP robot 114 is generally coupled to the base 170 and supports the polishing head 176 respectively on a plurality of arms 182 extending from the carousel 178. The CMP robot 114 may be indexed so that each polishing head 176 may be positioned above the load cup 180 to facilitate substrate transfer therewith and positioned over one of the polishing stations 112 to facilitate substrate polishing.

The polishing head 176 generally retains the substrate during transfer between the polishing stations 112 and the transfer station 118 and during processing. The polishing head 176 moves axially to press the substrate against a polishing material 184 disposed in the polishing station 112 during processing. Polishing the substrate is generally accomplished by moving the substrate while retained in the polishing head 176 in a polishing motion relative to the polishing material 184 in the presence of a polishing fluid.

The polishing station 112 generally includes a platen 186 that supports the polishing material 184. In one embodiment, the platen 186 and polishing material 184 disposed thereon rotate to provide the polishing motion. It is understood that any polisher providing a relative polishing motion (including those not explicitly described herein) may alternatively be utilized. For example, the polishing material 184 may be moved under the polishing head 176 in a linear, x/y or orbital motion. The polishing head 176 may rotate, move linearly, orbit or move in other motions relative to the polishing material 184 that may be moving or stationary. Some exemplary polishers that may be adapted to benefit from the invention are described in U.S. Pat. No. 5,738,573, issued Aug. 14, 1998 to Tolles, et al., U.S. Provisional Patent Application No. 60/185,812, filed Feb. 29, 2000, by Sommer, and in U.S. patent application Ser. No. 09/244,456, filed Feb. 4, 1999 now U.S. Pat. No. 6,244,935 by Birang, et al., all of which are hereby incorporated by reference in their entirety. It should be noted that other polishers provided by other equipment manufacturers could be modified to incorporate aspects of the invention.

The polishing material 184 may be conventional or fixed abrasive material. Conventional polishing material 184 is generally comprised of a foamed polymer and disposed as a pad on the platen 186. In one embodiment, the conventional polishing material 184 is a foamed polyurethane. Such conventional polishing material 184 is available from Rodel Corporation, located in Newark, Del.

Fixed abrasive polishing material 184 is generally comprised of a plurality of abrasive particles suspended in a resin binder that is disposed in discrete elements on a backing sheet. Fixed abrasive polishing material 184 may be utilized in either pad or web form. As the abrasive particles are contained in the polishing material 184 itself, systems utilizing fixed abrasive polishing materials generally utilize polishing fluids that do not contain abrasives. Examples of fixed abrasive polishing material 184 are disclosed in U.S. Pat. No. 5,692,950, issued Dec. 2, 1997 to Rutherford et al., and U.S. Pat. No. 5,453,312, issued Sep. 26, 1995 to Haas et al, both of which are hereby incorporated by reference in their entireties. Such fixed abrasive material is additionally available from Minnesota Manufacturing and Mining Company (3M), located in Saint Paul, Minn.

In one embodiment, the post-CMP treatment module 168 is described as incorporating the cleaner 106 residing within the factory interface. However, the post-CMP treatment module 168 (or the annealing station 172) may alternatively "stand-alone" outside the system 100 or may be disposed proximate the polisher 102 in conjunction with other modules (i.e., the cleaning module, deposition station, and the like) either on the polisher 102 or in the factory interface 108.

The cleaner 106 generally removes polishing residue such as polishing fluid (i.e., slurry), abraded material (from substrate and/or the polishing material 184) and other contaminants from the polished substrate. In one embodiment, the cleaner 106 generally includes a walking beam 148 that transports processed substrates through in a cleaner 106 of the cleaner 106 having the deposition station 174 integrated therein. The walking beam 148, which comprises a series of substrate grippers (not shown) connected to a horizontal bar (not shown), transports polished substrates through cleaning and/or deposition baths in the cleaner 106. The substrate is washed and scrubbed with cleaning fluids as the substrate moves through the cleaner 106 on the walking beam 148. In at least one portion of the cleaner 106, the substrate is sprayed or immersed in a plating-mediating fluid such as a plating fluid to form the metal-containing layer on the substrate. The substrate is moved through the cleaner 106 towards an end 154 as the slurry and other contaminants which may have accumulated on the substrate during polishing or deposition are removed. At the end of the cleaning sequence, the cleaned substrate is removed from the walking beam 148 by the factory interface robot 158 and placed in the annealing station 172. After annealing, the substrate is retrieved from the annealing station 172 by the interface robot 158 and returned to one of the wafer storage cassettes 110. One cleaner that may be adapted to benefit from the invention is described in U.S. patent Ser. No. 09/558,815, filed on Apr. 26, 2000 now U.S. Pat. No. 6,575,177 by Brown, et al., which is incorporated by reference herein in its entirety.

In another embodiment, the substrate may be fully cleaned in the cleaner 106 before being transferred to the deposition station 174 and annealing station 172 that are positioned in the factory interface 108. Alternatively, the substrate returning to the factory interface 108 may be positioned first in the deposition station 174, then transferred to the annealing station 172 before being passed through to the cleaner 106.

The deposition station 174 of the post-CMP treatment module 168 may alternatively be included in a cleaner different from that illustrated in FIG. 1, e.g., a cleaning system having different cleaning modules such as a megasonic cleaner, scrubber, spin-rinse-dryer and other substrate cleaning modules. For example, the deposition station 174 may be incorporated as part of a megasonic cleaner in the cleaner 106. Typically, a megasonic bath provided in the megasonic cleaner is maintained at a temperature between about 25 and about 100 degrees Celsius. At least a portion of the megasonic bath comprises an electroless plating solution to form the metal-containing layer on the substrate during megasonic cleaning. Details of a cleaning system that may be adapted to benefit from the invention is disclosed in commonly-assigned United States Provisional Patent Application No. 60/131,124, entitled "Semiconductor Substrate Cleaning System," filed on Apr. 27, 1999, which is incorporated herein by reference in it entirety. In addition, other embodiments of the deposition aspects of the invention may also be performed in different spin-rinse-dryers, for example, by dispensing the plating-mediating fluid, such as an electroless plating solution, through a fluid delivery system adapted for rinsing operations. Depending on the desired metal-containing layer, different electroless plating solutions can be used. One example of a spin-rinse-dryer that may be adapted to practice aspects invention is disclosed in commonly-assigned U.S. patent application Ser. No. 09/350,212, entitled "Edge Bead Removal/Spin Rinse Dry (EBR/SRD) Module", filed on Jul. 9, 1999, now U.S. Pat. No. 6,516,815 which is incorporated by reference herein in its entirety.

Figure 4:
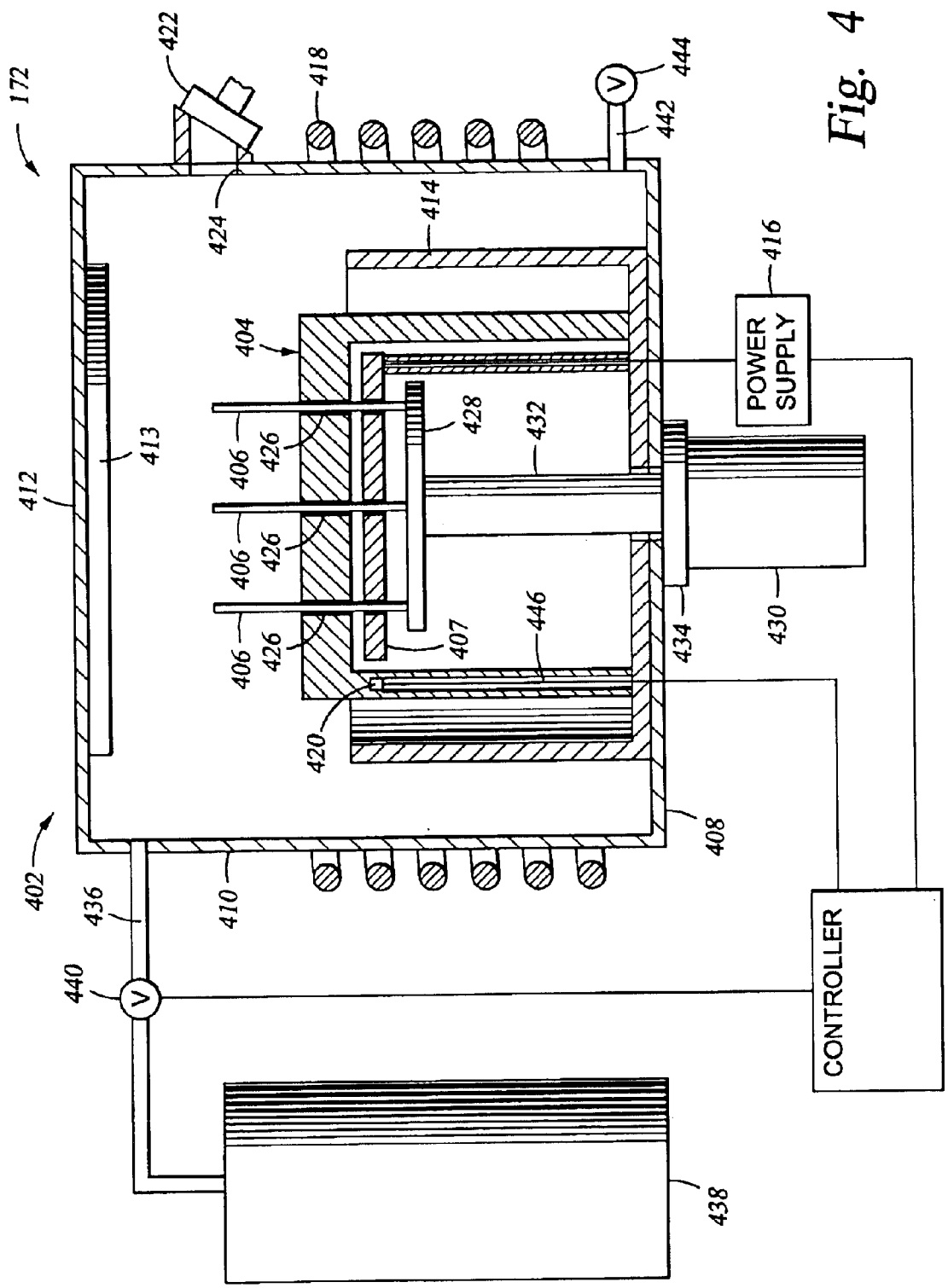
FIG. 4 depicts one embodiment of an annealing station.

FIG. 4 depicts one embodiment of the annealing station 172. The annealing station 172 is disposed in the cleaner 106 proximate the deposition station 174. Substrates having the metal-containing layer deposited in the annealing station 172 are generally transferred into and out of the annealing station 172 by either the walking beam 148 or the factory interface robot 158. Optionally, other robots may be utilized. The annealing station 172 may be configured to anneal a single substrate or to anneal multiple substrate in batches.

Thermal annealing stations are generally well known in the art, and rapid thermal anneal chambers are typically utilized in vacuum processing systems to enhance the properties of the deposited materials. The invention contemplates utilizing a variety of thermal anneal module designs, including hot plate designs and heat lamp designs, to enhance the electroplating results. Although the invention is described using a hot plate rapid thermal annealing station 172, the invention contemplates application of other thermal anneal modules as well.

The annealing station 172 generally comprises an enclosure 402, a heater plate 404, a heater 407 and a plurality of substrate support pins 406. The enclosure 402 includes a base 408, a sidewall 410 and a top 412. A cold plate 413 is disposed below the top 412 of the enclosure. Alternatively, the cold plate is integrally formed as part of the top 412 of the enclosure. A reflector insulator dish 414 is disposed inside the enclosure 402 on the base 408. The reflector insulator dish 414 is typically made from a material such as quartz, alumina, or other material that can withstand high temperatures (i.e., greater than about 500 degrees Celsius), and acts as a thermal insulator between the heater 407 and the enclosure 402. The dish 414 may also be coated with a reflective material, such as gold, to direct heat back to the heater plate 406.

The heater plate 404 preferably has a large mass compared to the substrate being processed in the system 100. The heater plate 404 is preferably fabricated from a material such as silicon carbide, quartz, or other materials that do not react with any ambient gases in the annealing station 172 or with the substrate material. The heater 407 typically comprises a resistive heating element or a conductive/radiant heat source and is disposed between the heated plate 406 and the reflector insulator dish 414. The heater 407 is connected to a power source 416 that supplies the energy needed to heat the heater 407. Preferably, a thermocouple 420 is disposed in a conduit 446, disposed through the base 408 and dish 414, and extends into the heater plate 404. The thermocouple 420 is connected to the controller (i.e., the system controller described below) and supplies temperature measurements to the controller. The controller then increases or decreases the heat supplied by the heater 407 according to the temperature measurements and the desired anneal temperature.

The enclosure 402 preferably includes a cooling member 418 disposed outside of the enclosure 402 in thermal contact with the sidewall 410 to cool the enclosure 402. Alternatively, one or more cooling channels (not shown) are formed within the sidewall 410 to control the temperature of the enclosure 402. The cold plate 413 disposed on the inside surface of the top 412 cools a substrate that is positioned in close proximity to the cold plate 413.

The annealing station 172 includes a slit valve 422 disposed on the sidewall 410 of the enclosure 402 for facilitating transfers of substrates into and out of the annealing station 172. The slit valve 422 selectively seals an opening 424 on the sidewall 410 of the enclosure. The factory interface robot 158 (see FIG. 1) transfers substrates into and out of the annealing station 172 through the opening 424.

The substrate support pins 406 preferably comprise distally tapered members constructed from quartz, aluminum oxide, silicon carbide, or other high temperature resistant materials. Each substrate support pin 406 is disposed within a tubular conduit 426, preferably made of a heat and oxidation resistant material, that extends through the heater plate 404. The substrate support pins 406 are connected to a lift plate 428 for moving the substrate support pins 406 in a uniform manner. The lift plate 428 is attached to an actuator 430, such as a stepper motor, through a lift shaft 432 that moves the lift plate 428 to facilitate positioning of a substrate at various vertical positions within the annealing station 172. The lift shaft 432 extends through the base 408 of the enclosure 402 and is sealed by a sealing flange 434 disposed around the shaft.

To transfer a substrate into the annealing station 172, the slit valve 422 is opened, and the factory interface robot 158 extends its robot blade having a substrate positioned thereon through the opening 424 into the annealing station 172. The robot blade of the factory interface robot 158 positions the substrate in the annealing station 172 above the heater plate 404, and the substrate support pins 406 are extended upwards to lift the substrate above the robot blade. The robot blade then retracts out of the annealing station 172 and the slit valve 422 closes the opening. The substrate support pins 406 are then retracted to lower the substrate to a desired distance from the heater plate 404. Optionally, the substrate support pins 406 may retract fully to place the substrate in direct contact with the heater plate 404.

Preferably, a gas inlet 436 is disposed through the sidewall 410 of the enclosure 402 to allow selected gas flow into the annealing station 172 during the annealing process. The gas inlet 436 is connected to a gas source 438 through a valve 440 for controlling the flow of the gas into the annealing station 172. A gas outlet 442 is preferably disposed at a lower portion of the sidewall 410 of the enclosure 402 to exhaust the gases out of the annealing station 172 and is preferably connected to a relief/check valve 444 to prevent backstreaming of atmosphere from outside of the annealing station 172. Optionally, the gas outlet 442 is connected to a vacuum pump (not shown) to exhaust the annealing station 172 to a desired vacuum level during an anneal treatment.

In one mode of operation, the substrate is annealed in the annealing station 172 after the substrate has been electroplated in the deposition station 174 and cleaned in the cleaner 106. Preferably, the annealing station 172 is maintained at about atmospheric pressure, and the oxygen content inside the annealing station 172 is controlled to less than about 100 ppm during the anneal treatment process. Preferably, the ambient environment inside the annealing station 172 comprises nitrogen ($N_2$) or a combination of nitrogen ($N_2$) and less than about 4% hydrogen ($H_2$), and the ambient gas flow into the annealing station 172 is maintained at greater than about 20 liters/min to control the oxygen content to less than about 100 ppm. The electroplated substrate is preferably annealed at a temperature between about 200 degrees Celsius and about 450 degrees Celsius for between about 30 seconds and about 30 minutes, and more preferably, between about 250 degrees Celsius and about 400 degrees Celsius for between about 1 minute and about 5 minutes. Rapid thermal anneal processing typically requires a temperature increase of at least about 20 degrees Celsius per second. To provide the required rate of temperature increase for the substrate during the anneal treatment, the heater plate 404 is preferably maintained at between about 350 degrees Celsius and about 450 degrees Celsius while the substrate is preferably positioned at between about 0 mm (i.e., contacting the heater plate 404) and about 20 mm from the heater plate for the duration of the anneal treatment process. Preferably, the controller described below controls the operation of the annealing station 172 (along with other aspects of the system 100), including maintaining the desired ambient environment in the annealing station 172 and the temperature of the heater plate 404.

After the anneal treatment process is completed, the substrate support pins 406 lift the substrate to a position for transfer out of the annealing station 172. The slit valve 422 opens, and the robot blade of the factory interface robot 158 is extended into the annealing station 172 and positioned below the substrate. The substrate support pins 406 retract to lower the substrate onto the robot blade, and the robot blade then retracts out of the annealing station 172. The factory interface robot 158 then transfers the processed substrate into the cassette 110 for removal out of the chemical mechanical polishing system 100. An example of an annealing station that may be adapted to benefit from the invention are described in U.S. Pat. No. 6,136,163, issued Oct. 24, 2000 to Cheung et al., which is incorporated by reference herein in its entirety.

Returning to FIG. 1, the system 100 is also coupled to a controller 190, which controls the system 100 and facilitates implementation of a treatment method described below. Illustratively, the controller 190 comprises a general purpose computer or a central processing unit (CPU) 192, support circuitry 194, and memories 196 containing associated control software. The controller 190 is responsible for automated control of the numerous steps required for substrate processing, such as substrate transport, substrate polishing, temperature control, substrate cleaning, and so on. Bi-directional communications between the controller 190 and the various components of the system 100 are handled through numerous signal cables collectively referred to as signal buses 198, some of which are illustrated in FIG. 1.

Figure 5:
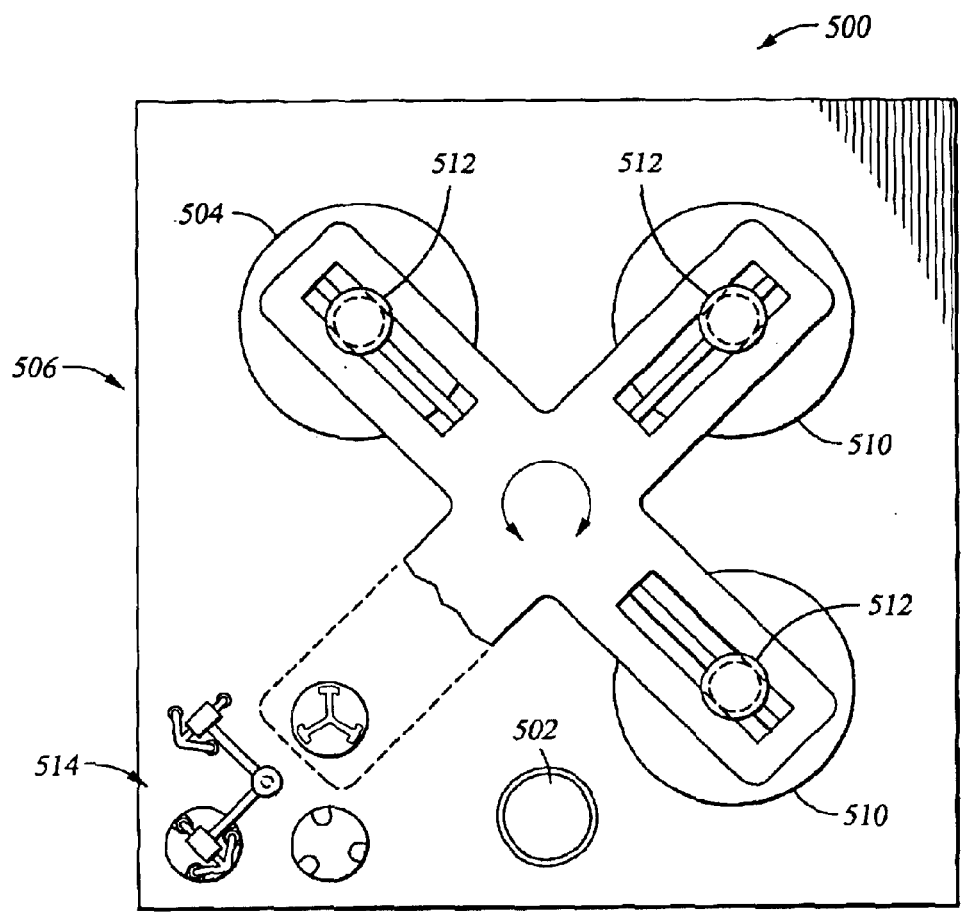
FIG. 5 depicts one embodiment of a chemical mechanical polishing system having an annealing station.
Figure 5:
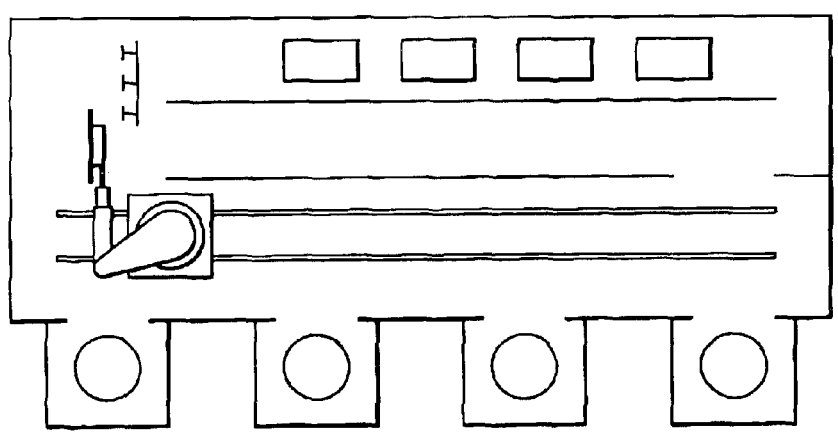

FIG. 5 depicts another embodiment of a chemical mechanical polishing system 500 having an annealing station 502. Generally, the system 500 is substantially similar to the system 100 described with reference to FIG. 1 except wherein a deposition station 504 is disposed on a polisher 506 along with one or more polishing stations 510. The annealing station 502 is typically disposed on the polisher 506 proximate the deposition station 504. The position of the deposition and annealing stations 504, 502 on the polisher 506 allows for deposition and annealing to occur either before or after polishing. The system 500 may additionally include a CMP-post treatment module 168 as described above disposed in a factory interface 508. Alternatively, the annealing station 502 may be disposed in the factory interface 508 alone or as described above in the CMP-post treatment module 168. Generally, the substrate is processed at the deposition station 504 and at the polishing stations 510 while retained in the polishing head 512. Typically, the substrate is loaded into and retrieved from the annealing station 502 by either a CMP robot 512 or a transfer robot 514.

Figure 6:
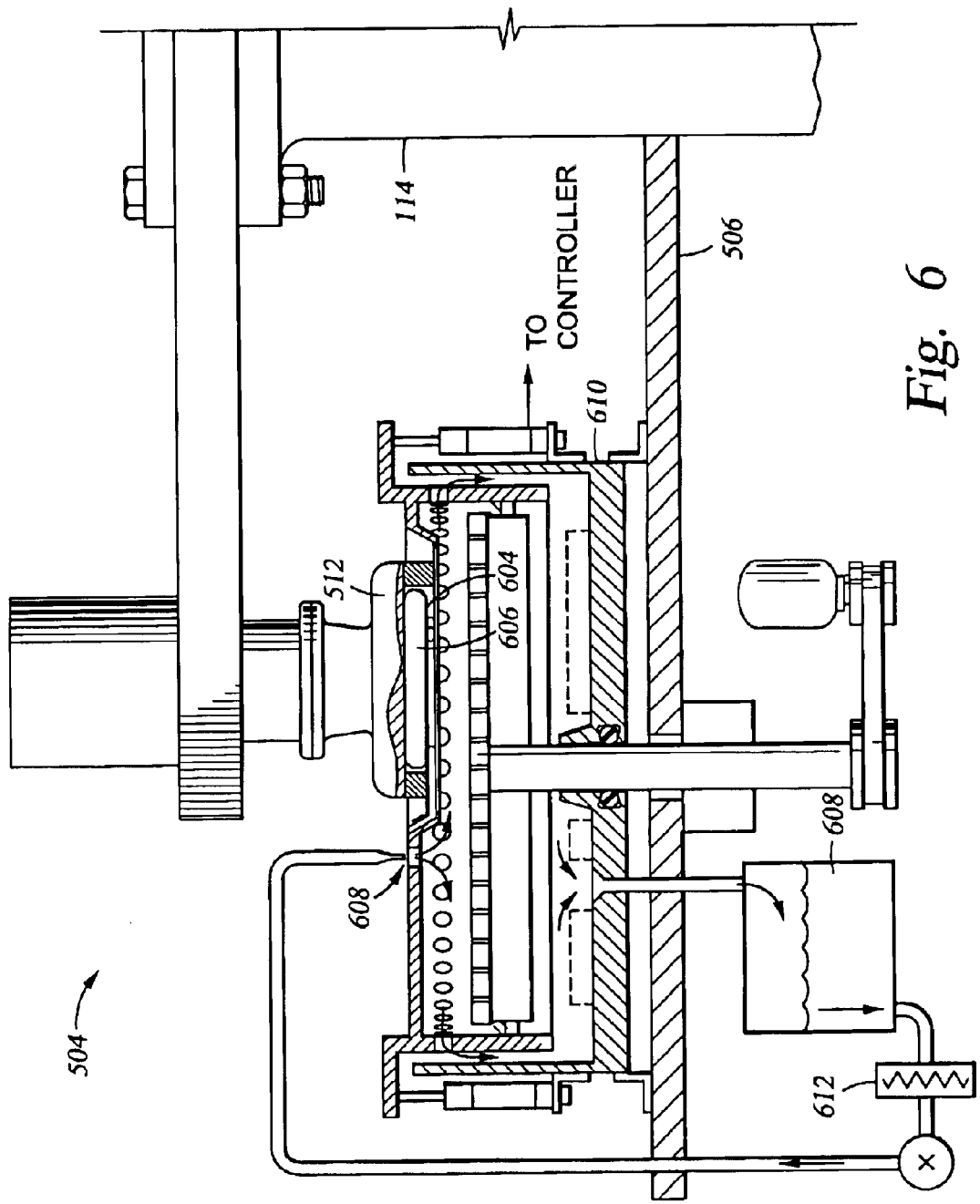
FIG. 6 depicts one embodiment of a deposition station of the system of FIG. 5.

FIG. 6 depicts one embodiment of the deposition station 504. Generally, the deposition station 504 is disposed on a base 602 of the polisher 506 in lieu of one of the polishing stations 510 (as compared to the polisher 102 of FIG. 1). The deposition station 504 generally exposes a surface 604 of the substrate 606 to be polished to a deposition fluid 608 to facilitate electroless or electroplating. The deposition fluid 608 is typically held in a basin 610 disposed on the polisher 506. Generally, the fluid 608 is circulated through a filter 612 to remove contamination from the fluid 608 that otherwise may come in contact with the substrate 606.

In one embodiment, the substrate 606 is electrically biased while in contact with the deposition fluid 608 to cause metallic ions present in the electrolyte to plate deposit on the substrate's surface 604, filling the features present on the surface 604 of the substrate 606 with a metal-containing layer. In another embodiment, the substrate is not biased as an electroless deposition occurs on the substrate as previously described.

The metal-containing layer is then planarized at one of the polishing stations 510. The metal-containing layer may be annealed before or after planarization. Optionally, the system 500 may include a post-CMP treatment module 168 disposed on the polisher 506 as described with reference in FIG. 1. Examples of a polisher having a deposition station that may be adapted to benefit from the invention are described in U.S. patent application Ser. No. 09/739,139, filed on Dec. 18, 2000 by Hsu et al., and in U.S. patent application Ser. No. 09/1770,559 filed on Jan. 26, 2001 now U.S. Pat. No. 6,618,200 by Li et al., both of which are incorporated by reference herein in their entireties.

Process

Figure 2:
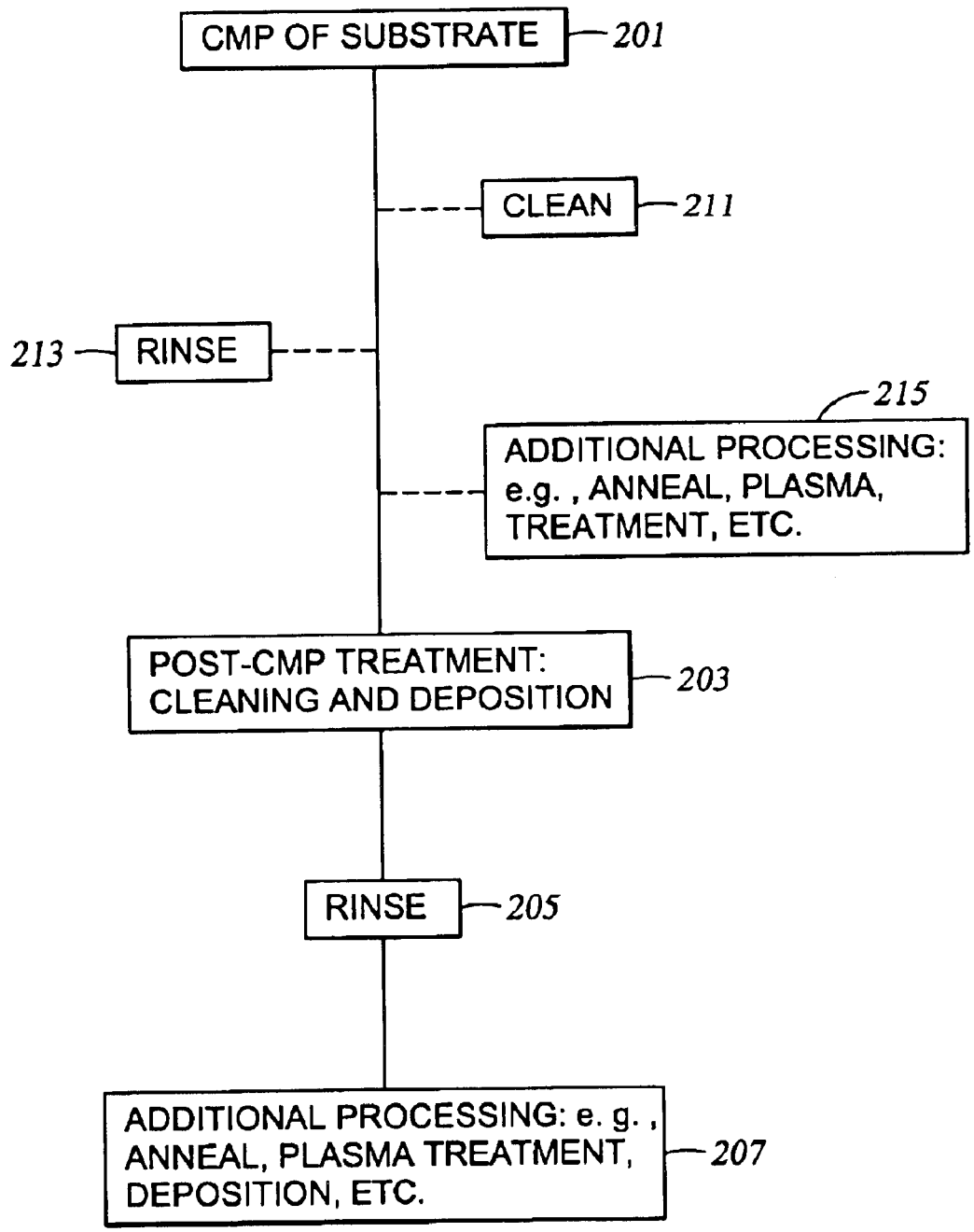
FIG. 2 depicts a flow diagram illustrating chemical mechanical processing incorporating aspect of the present invention.

FIG. 2 illustrates a substrate process sequence incorporating a method of the invention. In step 201, a substrate is subjected to CMP to produce a planarized structure by chemical, mechanical or chemical mechanical polishing. For example, the planarized structure may comprise a copper layer that has been deposited in a contact or via structure. According to one embodiment of the invention, the substrate is then subjected to a post-CMP treatment step 203. The treatment step 203 comprises cleaning the substrate and forming a metal-containing layer on the planarized structure of the polished substrate using an electroless process. The metal-containing layer may serve one or more functions—e.g., as an interface layer to improve adhesion between the copper layer and a subsequently deposited material layer, or as a barrier layer to minimize inter-diffusion between different material layers.

The metal-containing layer may be a single component metal layer, or it may be an alloy (or polyalloy) containing both metal and non-metal components. Examples include nickel, tin, cobalt, or cobalt tungsten phosphorus, among others. Different electroless plating solutions (or electrolytes) may be used for depositing the desired metal-containing layers, using process conditions that are known in the art. An electroless plating solution usually comprises a water-soluble salt containing a metal to be deposited, along with other components such as a reducing agent, complexing agent, or stabilizer, among others. Examples of a reducing agent include hypophosphorous acid, water soluble hypophosphites such as sodium or potassium hypophosphite, among others. A complexing agent may include, for example, carboxylic acids such as malic acid, citric acid, or sodium salts of carboxylic acids, and others that are known in the art. In some applications such as electroless nickel plating, a stabilizer such as water-soluble lead salts, e.g., lead acetate, may also be added to the electroless plating solution. For example, nickel and tin may be deposited from their respective sulphate or chloride salts, and many other water-soluble salts containing the desired metallic ions can also be used in the electroless plating solution. Exemplary solutions and conditions for electroless plating nickel and tin may be found, for example, in Uchida et al., U.S. Pat. No. 5,910,340, issued on Jun. 8, 1999, and in Uchida et al., U.S. Pat. No. 5,248,527, issued on Sep. 28, 1993, both of which are incorporated by reference herein in their entireties.

Furthermore, it is also possible to deposit an alloy containing a co-deposit of different elements by using an electroless solution containing suitable sources of these elements. For example, ternary alloys such as cobalt tungsten phosphorus (CoWP), may provide improved properties compared to other binary alloys. An electroless solution for depositing CoWP may contain, e.g., ammonium tungstenate as a source of tungsten ions, cobalt chloride as a source of cobalt ions, hypophosphite as a reducing agent and a source of phosphorus ions, citrate as a complexing agent, and other additives such as a pH adjuster and a surfactant, among others. The deposition of electroless CoWP alloys on copper damascene structures has been disclosed by Lopatin et al., in "Thin Electroless barrier for Copper Films", Proceedings of SPIE, Vol. 3508, pp.65–77 (Sep. 1998), and is incorporated by reference herein in its entirety.

Depending on the specific metals or alloys to be deposited, the concentrations and compositions of the electroless plating solutions to be used in embodiments of the invention may be adjusted as appropriate, using suitable parameter ranges known in the art. As an illustrative embodiment, nickel may be plated from an acidic nickel sulphate solution using sodium hypophosphite as a reducing agent. The solution may comprise about 87 g/l $NiSO_4.4H_2O$, 24 g/l $Na_2H_2PO_2.H_2O$, 30 g/l $CH_3COONa.3H_2O$, 4.1 g/l $C_3H_4(OH)(COOH)_3.H_2O$, 2 g/l $NaO_2C_3H_4COONa.6H_2O$, and 0.0015 g/l $Pb(CH_3COO)_2.3H_2O$. In the case of tin (Sn) electroless deposition, a solution of a tin salt, thiourea and an acid may be used. Such a solution may comprise, for example, about 45 g/l of thiourea and 5 g/l of stannous chloride, $SnCl_2.2H_2O$, and sulphuric acid. The sulphuric acid concentration may vary between about 1 and about 100 g/l. The use of these solutions for the electroless plating of Ni and Sn on copper surfaces have been disclosed by Lin et al., in "Manufacturing of Cu/Electroless Nickel/Sn—Pb Flip Chip Solder Bumps", IEEE Trans. Adv. Packaging, vol. 22, pp.575–579 (Nov. 1999), and by Sullivan et al., U.S. Pat. No. 2,369,620, issued on Feb. 13, 1945, both of which are incorporated by reference herein in their entireties. Typically, electroless deposition is performed at room temperature or above.

According to one embodiment of the invention, the formation of the metal-containing layer is integrated with the cleaning process of the substrate. The electroless plating solution is used during at least a part of the process to rinse the substrate. For example, substrate cleaning can be accomplished by spraying an electroless plating solution onto the copper surface as part of the cleaning sequence practiced in the apparatus 100. Particles or chemicals from the CMP slurry remaining on the substrate surface may be dislodged from the substrate by the spraying force. In another embodiment, the electroless plating solution can serve as a bath for both deposition and ultrasonic or megasonic cleaning. The substrate can be submerged in the electroless plating solution to rinse the substrate. In any case, the electroless plating solution serves a dual purpose—that of substrate cleaning as well as formation of a metal-containing layer.

The invention may be incorporated in different manners within a cleaning sequence, as shown in FIG. 2. For example, the post-CMP treatment step 203 (i.e., integrated cleaning and deposition) may be performed after an initial cleaning of the substrate. An initial cleaning step 211 may include spraying, ultrasonic or megasonic cleaning using a conventional cleaning fluid. As such, the integrated cleaning and deposition step 203 provides a secondary cleaning function. In this embodiment, a relatively clean copper surface for electroless plating is provided, and a uniform deposition can be achieved. If a cleaning fluid, other than de-ionized water, is used in the initial cleaning step 211, then the substrate is rinsed in step 213 with de-ionized water, in order to avoid possible undesirable reactions or contamination between the cleaning fluid and the plating solution. Alternatively, the substrate may also be cleaned and/or rinsed (sprayed or in ultrasonic or megasonic baths) initially in steps 211 and/or 213 using de-ionized water prior to electroless plating. Depending on the applications, it may be desirable to perform additional processing of the substrate, as shown in step 215, prior to the cleaning and deposition step 203. Such additional processing may, for example, include thermal anneal or plasma treatment of the copper layer or planarized structure on the substrate.

It is also possible that the integrated plating and cleaning step 203 be performed without any initial cleaning or rinsing steps 211 and 213. In this case, an appropriate electroless plating solution also serves as the primary cleaning fluid.

After the post-CMP treatment step 203 of the invention, at least one rinsing step 205 is performed to rinse off any residual electroless plating solution from the substrate surface. This rinsing step 205 may be performed, for example, in a conventional spin-rinse-dryer. Additional processing is then performed on the substrate in step 207. Such processing may include, for example, additional film treatment such as thermal anneal or plasma treatment of the substrate, deposition of a dielectric layer on the treated substrate surface, and so on, that are used in the fabrication of semiconductor devices.

In one embodiment, a thermal annealing process is performed in step 207. Generally, the temperature within the annealing chamber 168 is maintained between about 100 to 500 degrees Celsius for between about 1 second and about 60 minutes. The ambient atmosphere within the annealing chamber generally comprises $N_2$, $N_2$ and $H_2$, Ar, Ar and $H_2$, He, He and $H_2$ or other gas or gases which are non-reactive with the substrate and annealing chamber.

The integrated cleaning and deposition step 203 improves the properties of the copper surface in one or more aspects. Adhesion between the copper and subsequently deposited material layer may be enhanced due to the substrate cleaning and/or the metal-containing layer serving as an interface, adhesion-promoting layer. Furthermore, the metal-containing layer deposited in step 203, e.g., Ni or CoWP, may serve as a barrier layer, thus reducing electromigration of copper or undesirable inter-diffusion between copper and the subsequently deposited layer. Moreover, the annealing station 172 importantly energizes the exposed metal of the deposited layer to redistribute the metallic species at the surface of the deposited layer (i.e., along the grain boundaries). Additionally, having the annealing station 172 as part of the chemical mechanical polishing system 100 reduces in the number of substrates in process (WIP) by integrating multiple processes into a single tool, minimizes the system area required (footprint). and decreases the cost of ownership.

Figure 3A:
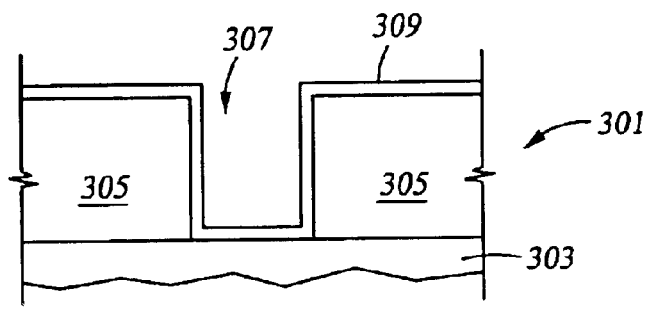
FIG. 3 depicts cross-sectional views of a substrate during various stages of metal processing according to the present invention.

FIGS. 3a-e illustrate cross-sectional views of a substrate 301 at different stages of processing, including the post-CMP treatment according to one embodiment the invention. FIG. 3a shows the substrate 301 comprising, for example, an insulating layer 305 that has been patterned to form a contact or via 307. In general, the underlying layer 303 may comprise silicon, polysilicon, silicides, aluminum, tungsten, or other conducting or semiconducting materials. Typically, a barrier layer 309 is also formed over the insulating layer 305 and inside the contact or via 307. Depending on the specific application, the barrier layer 309 may, for example, be a combination layer comprising a refractory metal and a metal nitride—e.g., titanium and titanium nitride, tantalum and tantalum nitride, or tungsten and its nitride. The barrier layer 309 is used to prevent undesirable diffusion of subsequently deposited metal into the underlying layer 303.

Figure 3B:
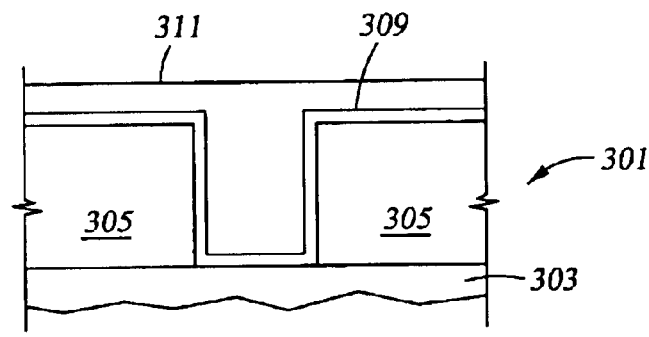
Figure 3C:
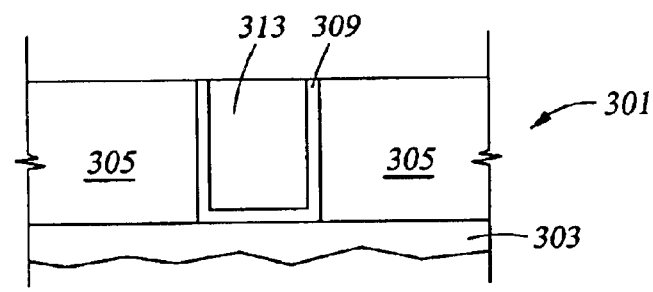

A copper layer 311 is then formed on the barrier layer 309, as shown in FIG. 3b. In general, the copper layer 311 may be formed by either chemical vapor deposition (CVD), physical vapor deposition (PVD) or electroplating methods. If electroplating is used, then a seed layer (not shown) is formed prior to the electroplated copper layer 311 to facilitate electroplating. The copper layer 311 of FIG. 3b is then subjected to planarization using CMP, in which at least a portion of the copper layer 311 is removed, resulting in a planarized structure comprising a polished copper layer 313, as shown in FIG. 3c. This polished copper layer 313 may also be referred to as a copper feature. As previously discussed in connection with FIG. 2, the substrate 301 may be subjected to cleaning, rinsing or other processing steps (not shown in FIG. 3) after CMP.

Figure 3D:
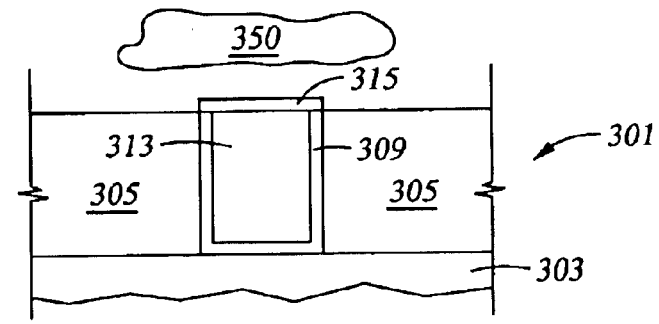

Thereafter, as shown in FIG. 3d, a post-CMP treatment is performed on the substrate 301, in which the substrate 301 is exposed to an electroless plating solution 350, for example, at room temperature. According to embodiments of the invention, a metal-containing layer 315 is deposited on the substrate 301 during the substrate cleaning with the electroless plating solution 350. As previously explained, electroless deposition can be performed by either spraying the electroless plating solution 350 onto the surface of the substrate 301, or by immersing the substrate 301 in a bath containing the electroless plating solution 350. For example, the metal-containing layer 315 may be nickel (Ni), tin (Sn), cobalt (Co), or alloys comprising different elements, e.g., cobalt tungsten phosphorus (CoWP). As previously discussed, Ni and Sn may be deposited from solutions comprising the respective sulphate or chloride salts. Many other salts that are known in the art may also be used. For example, Ronamerse 407—a plating solution available from LeaRonal of New York, is also suitable for depositing Sn on copper features. Electroless deposition can be achieved in less than about 30 seconds at room temperature by immersing a substrate containing copper features in a bath containing the Ronamerse 407 solution at about 50% dilution with water. The deposited Sn layer can promote adhesion with a subsequently deposited layer such as an oxide layer. When the metal-containing layer 315 is Ni or CoWP, then the metal-containing layer 315 can act as both an adhesion layer and a barrier layer.

According to one aspect of the invention, the clean copper surface acts as a catalyst for electroless deposition. By using an appropriate reducing agent in the electroless plating solution (e.g., one in which copper can catalyze a reduction reaction involving the reducing agent), the metal-containing layer 315 can be formed selectively on one or more copper features 313 of the substrate 301. For example, a hypophosphite is a suitable reducing agent for use in electroless Ni deposition. Furthermore, depending on the material used for the barrier layer 309, it is also possible to have electroless deposition on the barrier layer 309. As such, the metal-containing layer 315 is not formed on the insulating layer 305 that has been exposed after the completion of CMP. Depending on the specific application and process needs, the deposition time may be adjusted to produce a metal-containing layer 315 having any desired thickness. Typically, the metal-containing layer 315 is deposited to a thickness of less than about 1000 Å, preferably between about 10 and about 100 Å. In general, a relatively thin metal-containing layer 315 is preferred in order to avoid any excessive current passing through this metal-containing layer 315 during device operation. It is important, however, that the metal-containing layer 315 be formed as a continuous layer. Typically, a deposition time of less than about 30 seconds, or a few seconds, is sufficient to provide a continuous metal-containing layer 315. Depending on the desired thickness or process throughput, the deposition time can be adjusted accordingly. For example, a deposition time of about 5 minutes may be used without significant impact on the process throughput. Finally, the metal-containing layer is annealed.

Figure 3E:
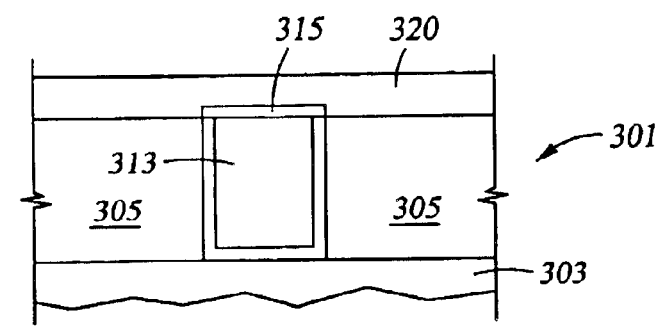

After the formation of the metal-containing layer 315 during the integrated cleaning/deposition/annealing treatment, processing continues for the substrate 301, e.g., with the deposition of an insulating layer 320, as shown in FIG. 3e. Depending on the specific properties of the metal-containing layer 305, the resulting structure may have improved properties such as reduced electromigration of the copper layer 313, better grain structure, enhanced corrosion resistance and/or enhanced adhesion of the insulating layer 320. Although the post-CMP treatment has been used as one illustrative embodiment of the invention, the integrated cleaning/deposition can generally be applied to other stages of a processing sequence involving a variety of substrates and metal-containing layers that can be formed by electroless processes.

Although several preferred embodiments which incorporate the teachings of the present invention have been shown and described in detail, those skilled in the art can readily devise many other varied embodiments that still incorporate these teachings.

What is claimed is:

1. A chemical mechanical polishing system comprising:
   a polisher;
   a factory interface;
   a transfer robot adapted to transfer substrates between the polisher and the factory interface;
   a deposition station disposed in the factory interface; and
   an annealing station disposed proximate the deposition station.

2. The system of claim 1, wherein the annealing station is a rapid thermal anneal module that includes hot plates or heat lamps.

3. The system of claim 1, wherein the annealing station further comprises:
   a sealable enclosure; and
   a heater plate disposed within the enclosure.

4. The system of claim 3, wherein the annealing station further comprises:
   a gas inlet disposed in a side wall of the enclosure and adapted to flow a selected gas into the enclosure during processing.

5. The system of claim 3, wherein the annealing station further comprises a cooling member disposed on an exterior of the enclosure.

6. The system of claim 1, wherein the factory interface further comprises:
   a cleaner having the deposition station disposed therein; and
   the annealing station is disposed in the factory interface.

7. The system of claim 6, wherein the annealing station is disposed in the cleaner.

8. The system of claim 1, wherein the polisher includes a polishing material that comprises fixed abrasives or foamed polyurethane.

9. The system of claim 8, wherein the polisher further comprises: a rotating platen that supports the polishing material.

10. A chemical mechanical polishing system comprising:
    a polisher;
    a cleaner disposed proximate the polisher;
    a transfer robot adapted to transfer substrates between the polisher and the cleaner;
    a deposition station disposed in the cleaner; and
    a rapid thermal annealing station disposed proximate the deposition station that includes hot plates or heat lamps.

11. The system of claim 10, wherein the annealing station further comprises:
    a sealable enclosure having a side wall;
    a heater plate disposed within the enclosure; and
    a gas inlet disposed in the side wall and adapted to flow a selected gas into the enclosure during processing.

12. The system of claim 11, wherein the annealing station further comprises a cooling member disposed on an exterior of the enclosure.

13. The system of claim 10, wherein the polisher further comprises a platen supporting a polishing material comprising foamed polyurethane or a fixed abrasive material.

* * * * *

UNITED STATES PATENT AND TRADEMARK OFFICE
CERTIFICATE OF CORRECTION

PATENT NO. : 6,818,066 B2
DATED : November 16, 2004
INVENTOR(S) : Robin Cheung

It is certified that error appears in the above-identified patent and that said Letters Patent is hereby corrected as shown below:

Column 9,
Line 5, please delete "09/1770,559" and insert -- 09/770,559 --;
Line 6, please delete "6,618,200" and insert -- 6,613,200 --.

Signed and Sealed this

Sixteenth Day of August, 2005

JON W. DUDAS
*Director of the United States Patent and Trademark Office*